United States Patent
Seki et al.

(10) Patent No.: US 8,716,121 B2
(45) Date of Patent: May 6, 2014

(54) OHMIC ELECTRODE AND METHOD OF FORMING THE SAME

(75) Inventors: Akinori Seki, Sunto-gun (JP); Masahiro Sugimoto, Toyota (JP); Akira Kawahashi, Komaki (JP); Yasuo Takahashi, Suita (JP); Masakatsu Maeda, Suita (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 13/384,850

(22) PCT Filed: Aug. 4, 2010

(86) PCT No.: PCT/IB2010/001941
§ 371 (c)(1),
(2), (4) Date: Jan. 19, 2012

(87) PCT Pub. No.: WO2011/015942
PCT Pub. Date: Feb. 10, 2011

(65) Prior Publication Data
US 2012/0132927 A1 May 31, 2012

(30) Foreign Application Priority Data
Aug. 5, 2009 (JP) .................. 2009-182541

(51) Int. Cl.
H01L 29/161 (2006.01)
H01L 21/28 (2006.01)
H01L 29/45 (2006.01)

(52) U.S. Cl.
USPC ........... 438/602; 438/586; 438/597; 438/584; 257/77; 257/482

(58) Field of Classification Search
CPC . H01L 21/0485; H01L 29/1608; H01L 29/45; H01L 29/66068
USPC ............. 257/77, 482; 438/602, 586, 597, 584
See application file for complete search history.

(56) References Cited

U.S. PATENT DOCUMENTS 7,786,393 B2 * 8/2010 Isberg et al. .................. 200/262
7,879,705 B2 * 2/2011 Kawahashi et al. ........... 438/571
(Continued)

FOREIGN PATENT DOCUMENTS

CN 1868096 A 11/2006
JP A-64-020616 1/1989
(Continued)

OTHER PUBLICATIONS

Jennings et al., "Analysis of Al/Ti, Al/Ni multiple and triple layer contacts to p-type 4H-SiC," *Solid-State Electronics*, vol. 51, No. 5, pp. 797-801, May 1, 2007.
(Continued)

*Primary Examiner* — Tom Thomas
*Assistant Examiner* — Benjamin Tzu-Hung Liu
(74) *Attorney, Agent, or Firm* — Oliff PLC

(57) ABSTRACT

An ohmic electrode for a p-type SiC semiconductor, and a method of forming the ohmic electrode. The ohmic electrode has an ohmic electrode layer, which has an amorphous structure and which is made of a $Ti_{(1-x-y)}Si_{(x)}C_{(y)}$ ternary film of which a composition ratio is within a composition range that is surrounded by two lines and two curves expressed by an expression x=0 (0.35≤y≤0.5), an expression y=−1.120x+0.5200 (0.1667≤x≤0.375), an expression y=1.778(x−0.375)²+0.1 (0≤x≤0.375) and an expression y=−2.504x²−0.5828x+0.5 (0≤x≤0.1667) and that excludes the line expressed by the expression x=0. The ohmic layer is directly laminated on a surface of a p-type SiC semiconductor.

2 Claims, 13 Drawing Sheets

(56) References Cited

U.S. PATENT DOCUMENTS

| | | | |
|---|---|---|---|
| 8,008,180 B2* | 8/2011 | Takahashi et al. | 438/597 |
| 2010/0236937 A1* | 9/2010 | Rosvall et al. | 205/443 |
| 2011/0287626 A1 | 11/2011 | Seki et al. | |

FOREIGN PATENT DOCUMENTS

| | | |
|---|---|---|
| JP | A-2003-086534 | 3/2003 |
| JP | A-2008-078434 | 4/2008 |
| JP | A-2008-078435 | 4/2008 |
| JP | A-2008-227174 | 9/2008 |
| JP | A-2010-177581 | 8/2010 |
| WO | WO 2008/035822 A1 | 3/2008 |
| WO | WO 2008/114838 A1 | 9/2008 |
| WO | WO 2009/063031 A2 | 5/2009 |

OTHER PUBLICATIONS

La Via et al., "Structural and electrical characterisation of titanium and nickel silicide contacts on silicon carbide," *Microelectronic Engineering*, vol. 60, No. 1-2, pp. 269-282, Jan. 1, 2002.

Written Opinion of the International Searching Authority issued in Application No. PCT/IB2010/001941; Dated Feb. 2, 2011.

International Search Report issued in Application No. PCT/IB2010/001941; Dated Feb. 2, 2011.

* cited by examiner

- PRE-SPUTTER DEPOSITION TREATMENT (REVERSE SPUTTER)
- CRYSTALLIZATION PREVENTED DURING SPUTTERING
  * RISE IN TEMPERATURE PREVENTED (THROUGH COOLING, RF POWER, PRESSURE OR THE LIKE)
- THERMAL TREATMENT NOT CARRIED OUT
- COMPOSITION RATIO IN COMPOSITION RANGE OF FIG. 3

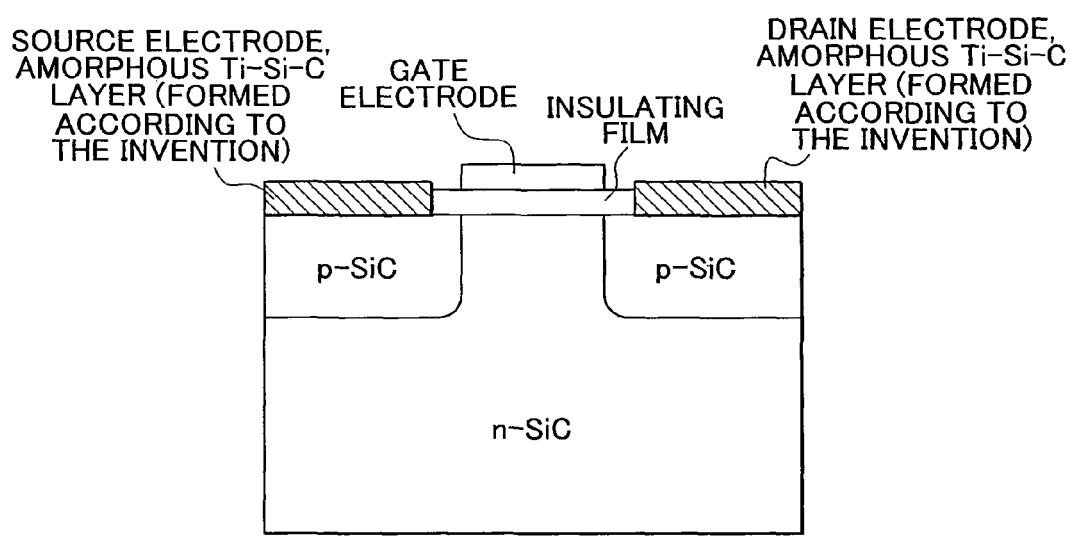
F I G . 13

OHMIC ELECTRODE AND METHOD OF FORMING THE SAME

BACKGROUND OF THE INVENTION

1. Field of the Invention

The invention relates to an ohmic electrode for a p-type SiC semiconductor and a method of forming the same. More specifically, the invention relates to an ohmic electrode for a p-type SiC semiconductor, which has an ohmic electrode layer which is improved in surface smoothness and in which x, y, and z ($z=1-x-y$) in $Ti_{(z)}Si_{(x)}C_{(y)}$ are within a specific range, the ohmic electrode layer being directly laminated on the p-type SiC semiconductor, and a method of forming the same.

2. Description of the Related Art

A SiC single crystal has features of being thermally and chemically very stable, being excellent in mechanical strength, and being resistant to radiation. In addition, the SiC single crystal has excellent properties of being higher in, for example, dielectric breakdown voltage and thermal conductivity than a silicon (Si) single crystal. Doping the SiC single crystal with dopants forms a p-type or n-type conduction carrier, and the electronic characteristics of the carrier are easily adjusted by adjusting the manner of doping the SiC single crystal with the dopants. The SiC single crystal has a wide band gap (a 4H-type single crystal SiC has a band gap of approximately 3.3 eV, and a 6H-type single crystal SiC has a band gap of approximately 3.0 eV). Thus, a high temperature, a high frequency, a breakdown voltage, and an environment resistance, which cannot be achieved by an existing semiconductor material, for example, a Si single crystal or a gallium arsenide (GaAs) single crystal, can be achieved by the SiC single crystal. Therefore, expectations for the SiC single crystal as a next-generation semiconductor material have been raised.

On the other hand, it is known that practical application of a semiconductor device requires an electrode demonstrating good ohmic properties, namely, an ohmic electrode. The electrode demonstrating good ohmic properties means a low-resistance electrode that demonstrates current-voltage characteristics with a linear relationship (i.e., lacks nonlinearity) between a current and a voltage regardless of the direction of the current and the magnitude of the voltage, and that allows the current to flow smoothly in both directions. In the case of a p-type SiC semiconductor, however, there has not been so far established a technology for stably forming an ohmic electrode. Thus, various proposals have been made regarding the development of the ohmic electrode for the p-type SiC semiconductor.

For example, Japanese Patent Application Publication No. 1-20616 (JP-A-1-20616) describes a method in which Al and Si are sequentially laminated on a p-type SiC single crystal and a thermal treatment is thereafter carried out to form an ohmic electrode. More specifically, JP-A-1-20616 describes a method of forming an electrode for a p-type SiC semiconductor, in which a carrier concentration of the p-type SiC single crystal is set to a value equal to or higher than $1 \times 10^{17}/cm^3$ and a thermal treatment temperature is set to 400° C. to 500° C. Japanese Patent Application Publication No. 2003-86534 (JP-A-2003-86534) describes an ohmic electrode for a SiC semiconductor, which is formed by connecting an electrode to a first reaction layer that is formed on a p-type SiC semiconductor substrate in the form of a film through a thermal treatment and that contains C, Si, Al and a magnetic material forming an intermetallic compound with Si. JP-A-2003-86534 also describes a method of forming an ohmic electrode for a SiC semiconductor, which includes a first step of laminating an Al film and a Ni film on a surface of a p-type SiC semiconductor substrate, a second step of carrying out a thermal treatment in vacuum to form a first reaction layer, and a third step of connecting an electrode to the first reaction layer.

Japanese Patent Application Publication No. 2008-78434 (JP-A-2008-78434) describes a method of forming a semiconductor device that does not contain by-products such as $Al_4C_3$, $Ti_5Si_3Cx$ and TiC. The method includes a first step of forming a Ti layer in contact with a SiC semiconductor layer and a second step of raising a temperature of the SiC semiconductor layer and the Ti layer to a temperature higher than a first reference temperature at which Ti and Al react with each other to produce $Al_3Ti$ and lower than a second reference temperature at which $Al_3Ti$ and SiC react with each other to produce $Ti_3SiC_2$ and forming an Al layer on the Ti layer. In the second step, SiC of the SiC semiconductor layer and $Al_3Ti$ react with each other to produce $Ti_3SiC_2$ and thus form a $Ti_3SiC_2$ layer in ohmic contact with the SiC semiconductor. However, the aforementioned publication does not describe the smoothness of a surface of the electrode after the thermal treatment.

Japanese Patent Application Publication. No. 2008-78435 (JP-A-2008-78435) describes a method of forming a semiconductor device that has a low contact resistance and does not contain by-products such as $Al_4C_3$, $Ti_5Si_3C_x$ and TiC. The method includes a first step of forming a Ti layer in contact with a SiC semiconductor layer, a second step of forming an Al layer on the Ti layer, a third step of subjecting the SiC semiconductor layer, the Ti layer, and the Al layer to a thermal treatment at a temperature higher than a first reference temperature at which Ti and Al react with each other to produce $Al_3Ti$ and lower than a second reference temperature at which $Al_3Ti$ and SiC react with each other to produce $Ti_3SiC_2$ and thus forming an $Al_3Ti$ layer, and a fourth step of subjecting the SiC semiconductor layer and the $Al_3Ti$ layer to a thermal treatment at a temperature higher than the second reference temperature after completion of reaction forming $Al_3Ti$ from Ti and Al, to form a $Ti_3SiC_2$ layer in ohmic contact with the SiC semiconductor layer. However, the aforementioned publication does not describe the smoothness of a surface of the electrode after the thermal treatment.

Japanese Patent Application Publication No. 2008-227174 (JP-A-2008-227174) describes a method of forming an ohmic electrode on a P-type 4H—SiC substrate. This method includes a lamination step of sequentially laminating a first Al layer, a Ti layer, and a second Al layer, each of which has a thickness of 1 nm to 60 nm, on the P-type 4H—SiC substrate, and an alloying step of forming an alloy layer of the SiC substrate and the Ti layer using the first Al layer as a medium for reaction through a thermal treatment in a non-oxidizing atmosphere. However, the aforementioned publication does not describe the smoothness of a surface of the electrode after the thermal treatment. In addition, some of the aforementioned related art adopt a deposition-and-annealing (DA) method. According to the DA method, when an ohmic electrode for a p-type SiC semiconductor is formed, an Al deposited film and a Ti deposited film, which are actually unnecessary for the reaction, are formed in a laminated manner to form a $Ti_3SiC_2$ layer, and a thermal treatment is carried out at a temperature of approximately 1000° C. This thermal treatment leads to an interface reaction of the SiC used as a semiconductor material and Ti and Al deposited thereon and formation of a thin intermediate semiconductor layer that is made of $Ti_3SiC_2$ and that is in contact with the SiC semiconductor.

In the method of forming the electrode according to the related art, it is difficult to form an intermediate semiconductor layer made of $Ti_3SiC_2$ with a uniform thickness on an entire electrode portion on a SiC semiconductor, and compounds such as $Al_4C_3$, $Ti_5Si_3C_x$ and TiC, $Al_3Ti$ are produced as by-products on an interface between the electrode portion and the intermediate semiconductor layer. Since an interface region where these by-products exist is high in contact resistance, it is difficult to reduce the contact resistance of the electrode on the SiC semiconductor to an appropriate ohmic resistance. Further, Al reacts with SiC to form an alloy and unevenly erodes SiC. As a result, the surface of the electrode becomes rough, and wiring to the outside is difficult. In order to form a low-resistance ohmic electrode on a p-type SiC semiconductor, a method of subjecting a semiconductor region directly below an electrode to a heavy doping treatment to reduce the thickness of a Schottky barrier is effective as in the case of other p-type wide-band-gap semiconductors. However, in the DA method according to the related art, since an interface reaction between a semiconductor substrate and a deposited film is utilized, the semiconductor region directly below the electrode subjected to the heavy doping treatment is consumed in the interface reaction.

As described hitherto, according to the related art, an electrode demonstrating low smoothness or low ohmic properties is obtained. Although the smoothness is slightly improved by lowering the temperature of the thermal treatment, the interface reaction does not progress, and only an electrode demonstrating low ohmic properties and high contact resistance is obtained. Thus, the inventors applied for a patent on an ohmic electrode having an ohmic electrode layer made of $Ti_3SiC_2$ and directly laminated on a surface of a p-type SiC semiconductor and a method of forming the ohmic electrode, in the form of Japanese Patent Application No. 2009-020850.

As a result of further studies, the inventors found out that although an ohmic electrode demonstrating good ohmic properties is obtained according to the invention described in the aforementioned patent application, the composition ratio needs to be strictly controlled. In addition that the inventors found out that there is a crystal grain boundary in the electrode layer because the electrode layer has a polycrystalline structure, and the electrode may be corroded due to penetration of chemicals into the crystal grain boundary if the surface of the electrode is exposed in a step following formation of the electrode.

SUMMARY OF INVENTION

The invention provides an ohmic electrode for a p-type SiC semiconductor, which has an ohmic electrode layer that has ohmic properties and has an amorphous structure, the ohmic electrode layer being directly laminated on a surface of the p-type SiC semiconductor. Further, the invention provides a method of forming the ohmic electrode for the p-type SiC semiconductor.

A first aspect of the invention relates to an ohmic electrode for a p-type SiC semiconductor, wherein an ohmic electrode layer, which forms the ohmic electrode, which has an amorphous structure and which is made of a $Ti_{(1-x-y)}Si_{(x)}C_{(y)}$ ternary film of which a composition ratio is within a composition range that is surrounded by two lines and two curves expressed by an expression $x=0$ $(0.35 \leq y \leq 0.5)$, an expression $y=-1.120x+0.5200$ $(0.1667 \leq x \leq 0.375)$, an expression $y=1.778(x-0.375)^2+0.1$ $(0 \leq x \leq 0.375)$ and an expression $y=-2.504x^2-0.5828x+0.5$ $(0 \leq x \leq 0.1667)$ and that excludes the line expressed by the expression $x=0$, is directly laminated on a surface of a p-type SiC semiconductor.

A second aspect of the invention relates to a method of forming an ohmic electrode for a p-type SiC semiconductor. According to the method, an ohmic electrode layer, which forms the ohmic electrode, which has an amorphous structure and which is made of a $Ti_{(1-x-y)}Si_{(x)}C_{(y)}$ ternary film of which a composition ratio is within a composition range that is surrounded by two lines and two curves expressed by an expression $x=0$ $(0.35 \leq y \leq 0.5)$, an expression $y=-1.120x+0.5200$ $(0.1667 \leq x \leq 0.375)$, an expression $y=1.778(x-0.375)^2+0.1$ $(0 \leq x \leq 0.375)$ and an expression $y=-2.504x^2-0.5828x+0.5$ $(0 \leq x \leq 0.1667)$ and that excludes the line expressed by the expression $x=0$, is directly laminated on a surface of a p-type SiC semiconductor.

A third aspect of the invention relates to a method of forming an ohmic electrode for a p-type SiC semiconductor. According to the method, a surface of a p-type semiconductor is subjected to a pre-sputter deposition treatment, and an ohmic electrode layer, which forms the ohmic electrode, which is made of a $Ti_{(1-x-y)}Si_{(x)}C_{(y)}$ ternary film of which a composition ratio is within a composition range that is surrounded by two lines and two curves expressed by an expression $x=0$ $(0.35 \leq y \leq 0.5)$, an expression $y=-1.120x+0.5200$ $(0.1667 \leq x \leq 0.375)$, an expression $y=1.778(x-0.375)^2+0.1$ $(0 \leq x \leq 0.375)$ and an expression $y=-2.504x^2-0.5828x+0.5$ $(0 \leq x \leq 0.1667)$ and that excludes the line expressed by the expression $x=0$, is directly laminated on the surface of the p-type SiC semiconductor directly laminating through sputter deposition. A temperature in a sputtering chamber during the sputter deposition is adjusted to a temperature at which crystallization of the electrode layer does not occur, and a thermal treatment at a temperature at which crystallization of the electrode layer occurs is prohibited after the sputter deposition.

The characteristics of the electrode layer in the aspects of the invention are prescribed by a measuring method that will be described later in the section of Examples of the invention.

According to the foregoing aspects of the invention, it is possible to obtain an ohmic electrode for a p-type SiC semiconductor, wherein an ohmic electrode layer that has ohmic properties and that has an amorphous structure is directly laminated on a surface of the p-type SiC semiconductor. Further, according to the foregoing aspects of the invention, it is possible to easily obtain an ohmic electrode for a p-type SiC semiconductor, wherein an ohmic electrode layer that has ohmic properties and that has an amorphous structure is directly laminated on a surface of the p-type SiC semiconductor.

BRIEF DESCRIPTION OF THE DRAWINGS

The features, advantages, and technical and industrial significance of this invention will be described in the following detailed description of an example embodiment of the invention with reference to the accompanying drawings, in which like numerals denote like elements, and wherein:

FIG. 13 is a schematic view showing an example of a field-effect transistor made of SiC as an application example of the ohmic electrode for the p-type SiC semiconductor according to the invention;

DETAILED DESCRIPTION OF EMBODIMENT

Figure 1:
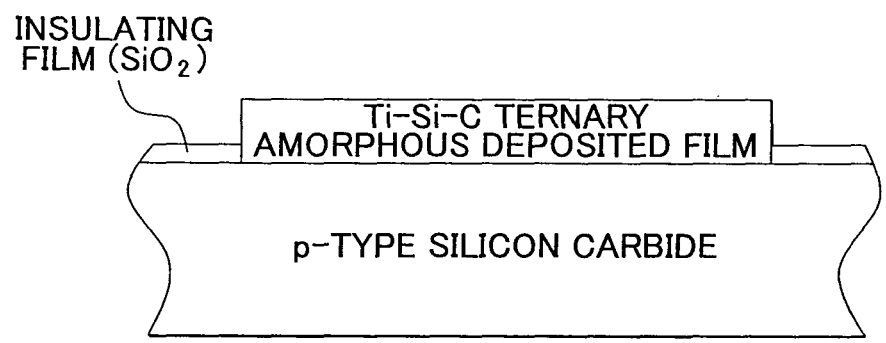
FIG. 1 is a schematic view showing an ohmic electrode for a p-type SiC semiconductor according to an embodiment of the invention.
Figure 2:
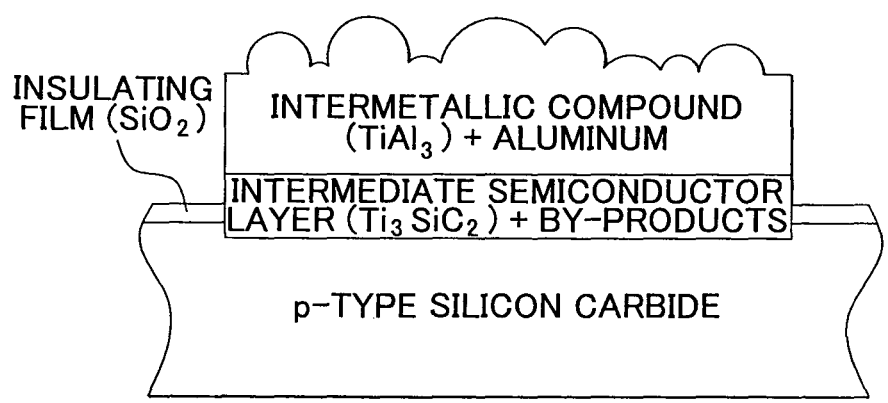
FIG. 2 is a schematic view showing an example of an ohmic electrode for a p-type SiC semiconductor according to related art.

The invention will be described hereinafter in detail with reference to the drawings. As is apparent from a comparison between FIG. 1 and FIG. 2, an ohmic electrode for a p-type SiC semiconductor according to an embodiment of the invention is a $Ti_{(1-x-y)}Si_{(x)}C_{(y)}$ ternary film of which the composition ratio is within a specific composition range, has an amorphous structure, has an ohmic electrode layer that does not contain impurities, and exhibits good surface smoothness as shown in FIG. 1, whereas an ohmic electrode for a p-type SiC semiconductor according to related art exhibits low surface smoothness due to a mixed layer of an intermetallic compound ($TiAl_3$) and a coagulation of Al on an intermediate semiconductor layer that contains $Ti_3SiC_2$ and by-products as shown in FIG. 2.

Figure 3:
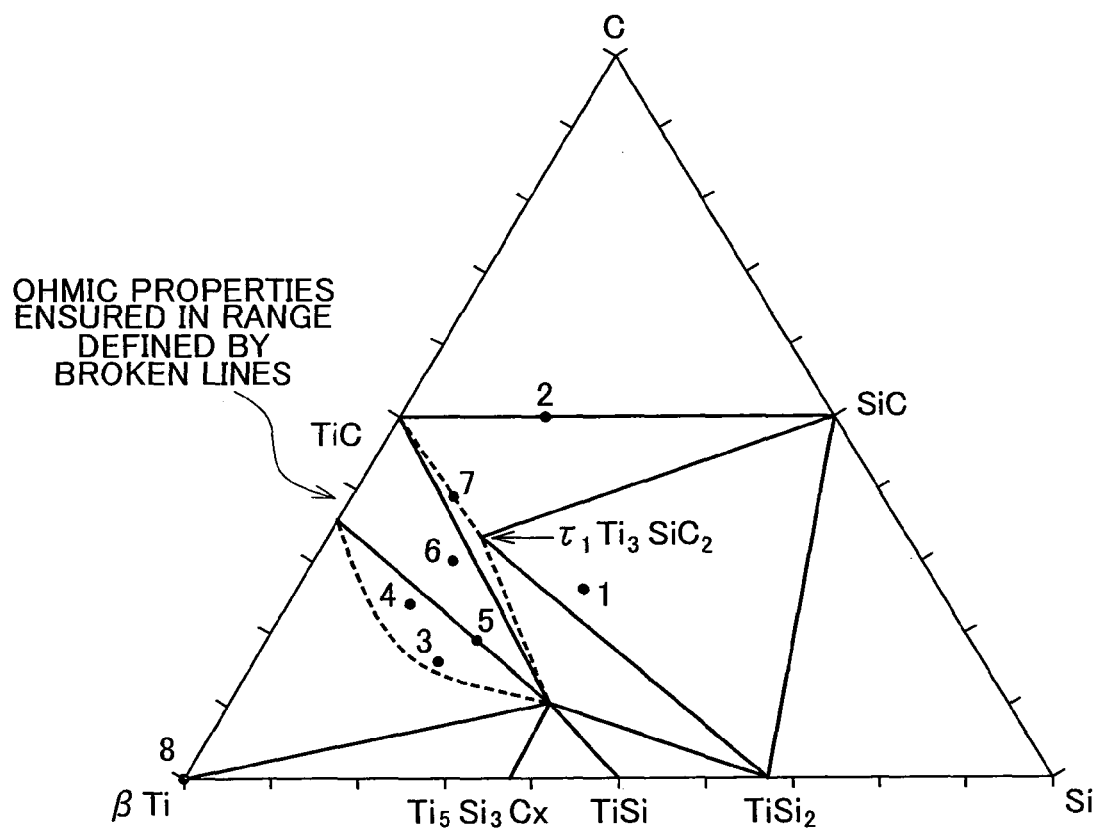
FIG. 3 is a graph showing a composition range of composition ratios between three elements, namely, Ti, Si, and C, at which ohmic properties are demonstrated.

Referring to FIG. 3, the ohmic electrode layer according to the invention obtains ohmic properties due to the presence of a $Ti_{(1-x-y)}Si_{(x)}C_{(y)}$ ternary film of which the composition ratio is within a composition range surrounded by two lines and two curves expressed by expressions (I) to (IV) shown below (the range excludes a line x=0) on a triangular coordinate having Ti, Si and C as its peaks, and thus in a composition range including these lines and curves except the line x=0; (I) x=0 ($0.35 \leq y \leq 0.5$), (II) $y=1.778(x-0.375)^2+0.1$ ($0 \leq x \leq 0.375$), (III) $y=-1.120x+0.5200$ ($0.1667 \leq x \leq 0.375$), (IV) $y=-2.504x^2-0.5828x+0.5$ ($0 \leq x \leq 0.1667$). On five points: 3, 4, 5, 6 and 7 within the composition range in FIG. 3, ohmic properties are obtained, and an electrode layer having ohmic properties is obtained without the need to strictly control the composition ratio thereof. It should be noted that ohmic properties are not obtained on three points 1, 2 and 8 located outside the composition range.

Figure 4:
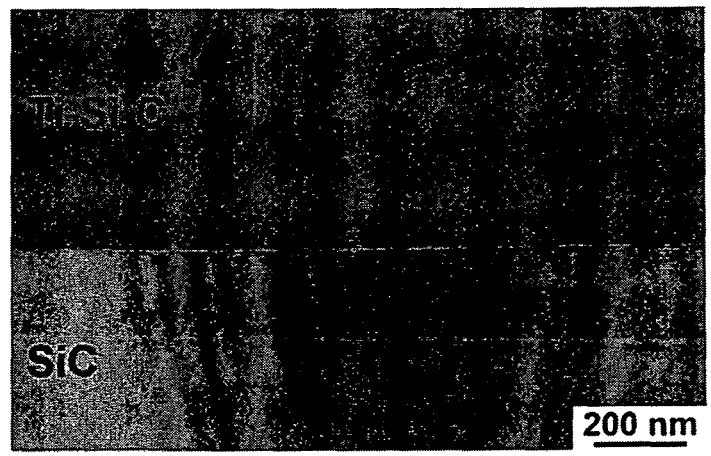
FIG. 4 is a copy of a TEM photograph of the ohmic electrode for the p-type SiC semiconductor according to an example of the invention.
Figure 5:
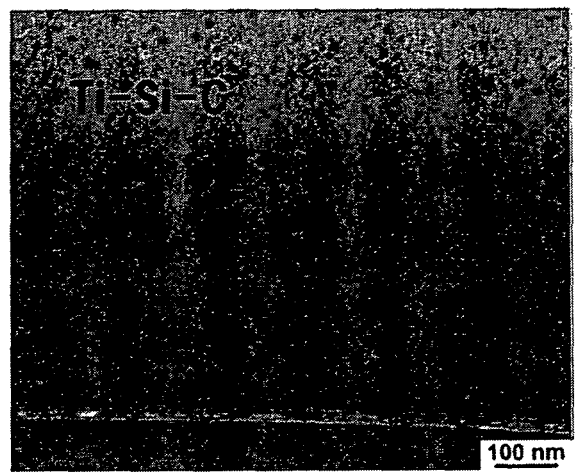
FIG. 5 is a copy of a TEM photograph of an ohmic electrode for a p-type SiC semiconductor according to a comparative example.

Furthermore, referring to FIGS. 4 and 5, the ohmic electrode layer according to the invention has an amorphous structure, has a smooth surface pattern, is homogeneous over the entirety thereof, and does not have any crystal grain boundary as shown in FIG. 4, whereas a $Ti_3SiC_2$ ohmic electrode layer having a polycrystalline structure has crystal grain boundaries in the layer and on a surface thereof as shown in FIG. 5.

As described above, the ohmic electrode layer according to the invention has an amorphous structure, is homogeneous over the entirety thereof, and does not have any crystal grain boundary. Therefore, the exposed ohmic electrode layer can be prevented from being corroded by chemicals, for example, a developing solution containing, for example, acids or strong acids or weakly alkaline components or from being penetrated by the chemicals during a step following formation of the ohmic electrode such as wiring and processing step or a semiconductor step. That is, the ohmic electrode layer according to the invention can be improved in resistance to corrosion, resistance to chemicals, and resistance to the penetration of chemicals. Furthermore, the ohmic electrode layer according to the invention has the smooth surface pattern and therefore wiring to the outside is easily performed. In contrast, the aforementioned $Ti_3SiC_2$ ohmic electrode layer having the polycrystalline structure has the crystal grain boundaries. Therefore, the aforementioned chemicals used in the step following formation of the ohmic electrode penetrate into the grain boundaries, that is, gaps among grains. As a result, the grain boundaries are enlarged to increase the degree of irregularity and thus can make wiring and the like difficult. Further, the chemicals accumulated on the grain boundaries may corrode the electrode layer itself or other electrode materials or wiring materials (e.g., Al, AlSi, Cu and the like). In addition, strict composition ratio control is required to produce the aforementioned $Ti_3SiC_2$ ohmic electrode layer having the polycrystalline structure. Besides, the sputtering film-forming characteristics of Ti, Si and C change depending on the characteristics of each sputtering device, and it is therefore difficult to achieve the accurate composition ratio of $Ti_3SiC_2$. Further, for the reason mentioned above, different composition ratios may be achieved despite the use of $Ti_3SiC_2$ as a sputtering target when a certain type of sputtering device is used. Further, in some cases, ohmic properties cannot be obtained due to a deviation in composition ratio resulting from the cumulative use during sputter deposition. Then, ohmic properties may not emerge in spite of the performance of a thermal treatment when the deviated composition ratio has a certain value. For these reasons and the like, the production yield decreases, and the use of the target may be impossible.

Figure 6:
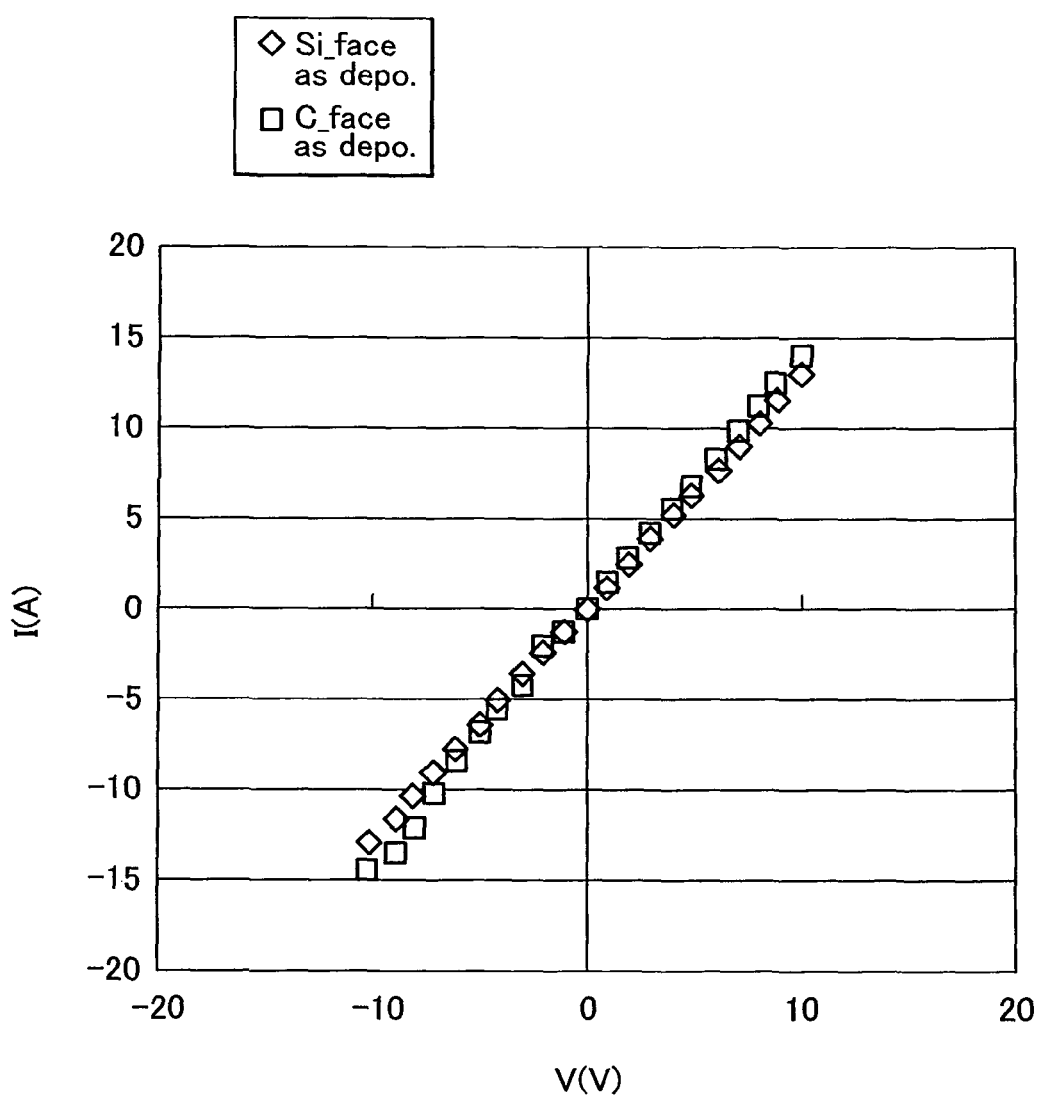
FIG. 6 is a graph showing current-voltage characteristics of the ohmic electrode for the p-type SiC semiconductor according to the example of the invention.
Figure 7:
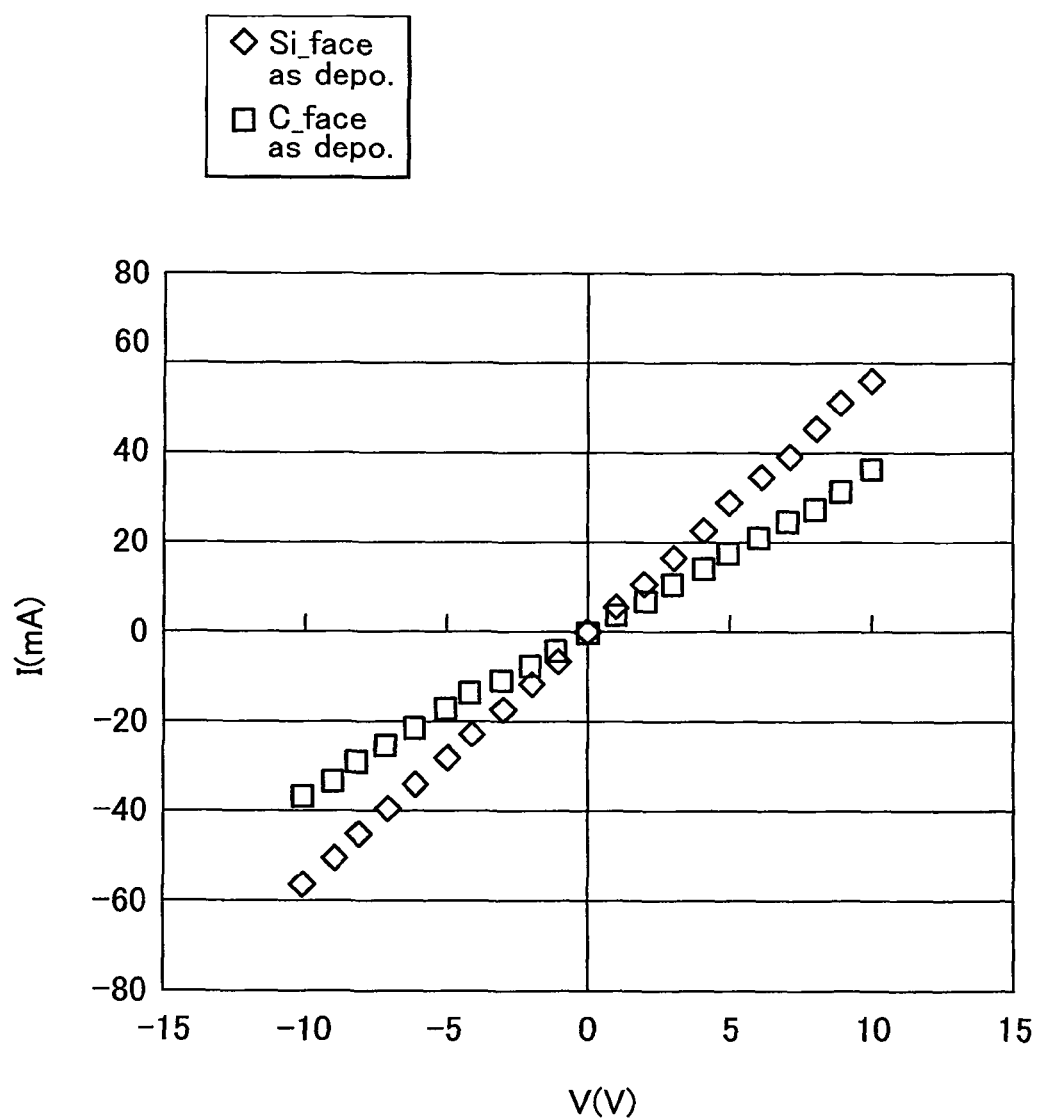
FIG. 7 is a graph showing current-voltage characteristics of an ohmic electrode for a p-type SiC semiconductor according to another example of the invention.
Figure 8:
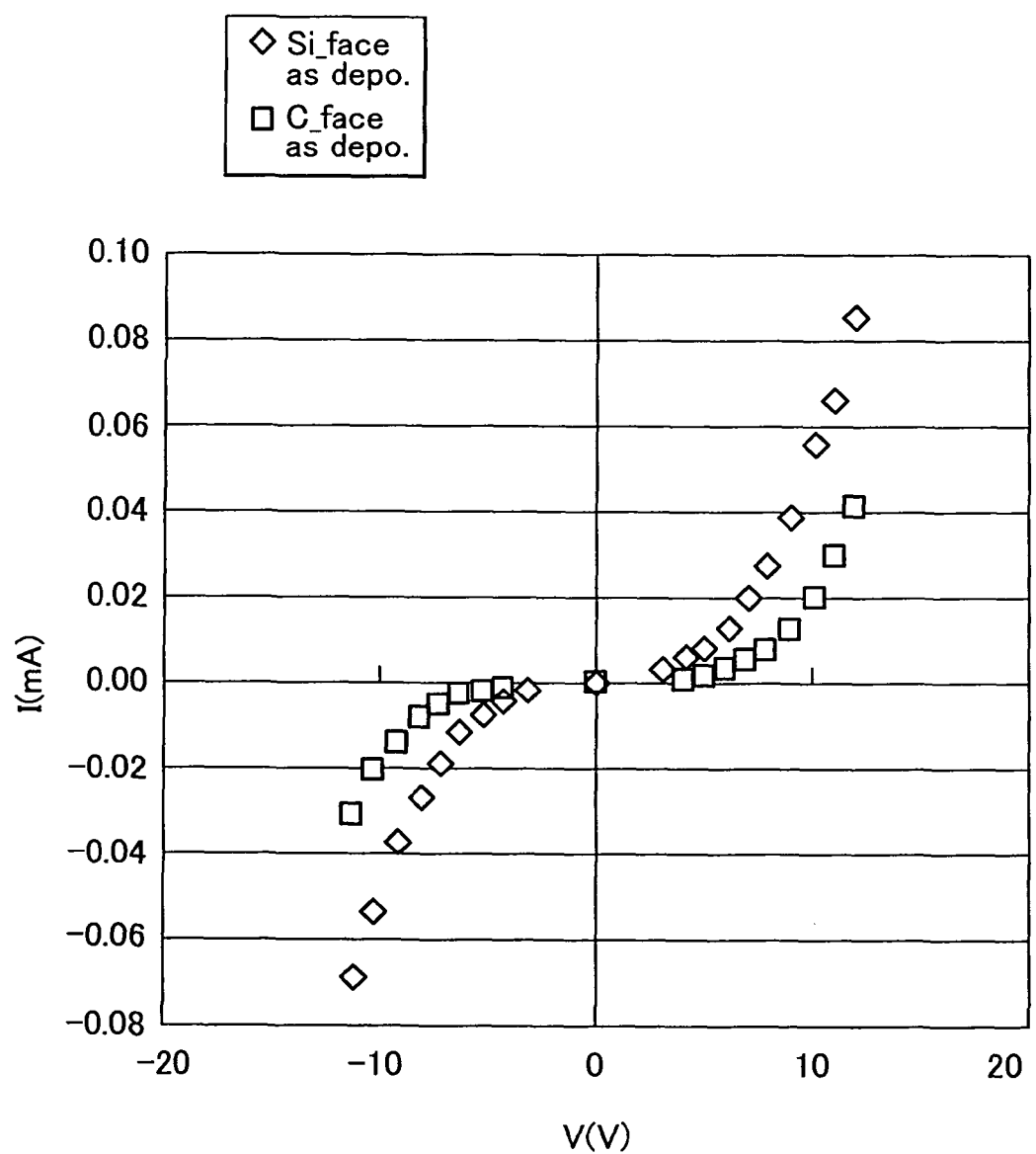
FIG. 8 is a graph showing current-voltage characteristics of an ohmic electrode for a p-type SiC semiconductor according to a comparative example.
Figure 9:
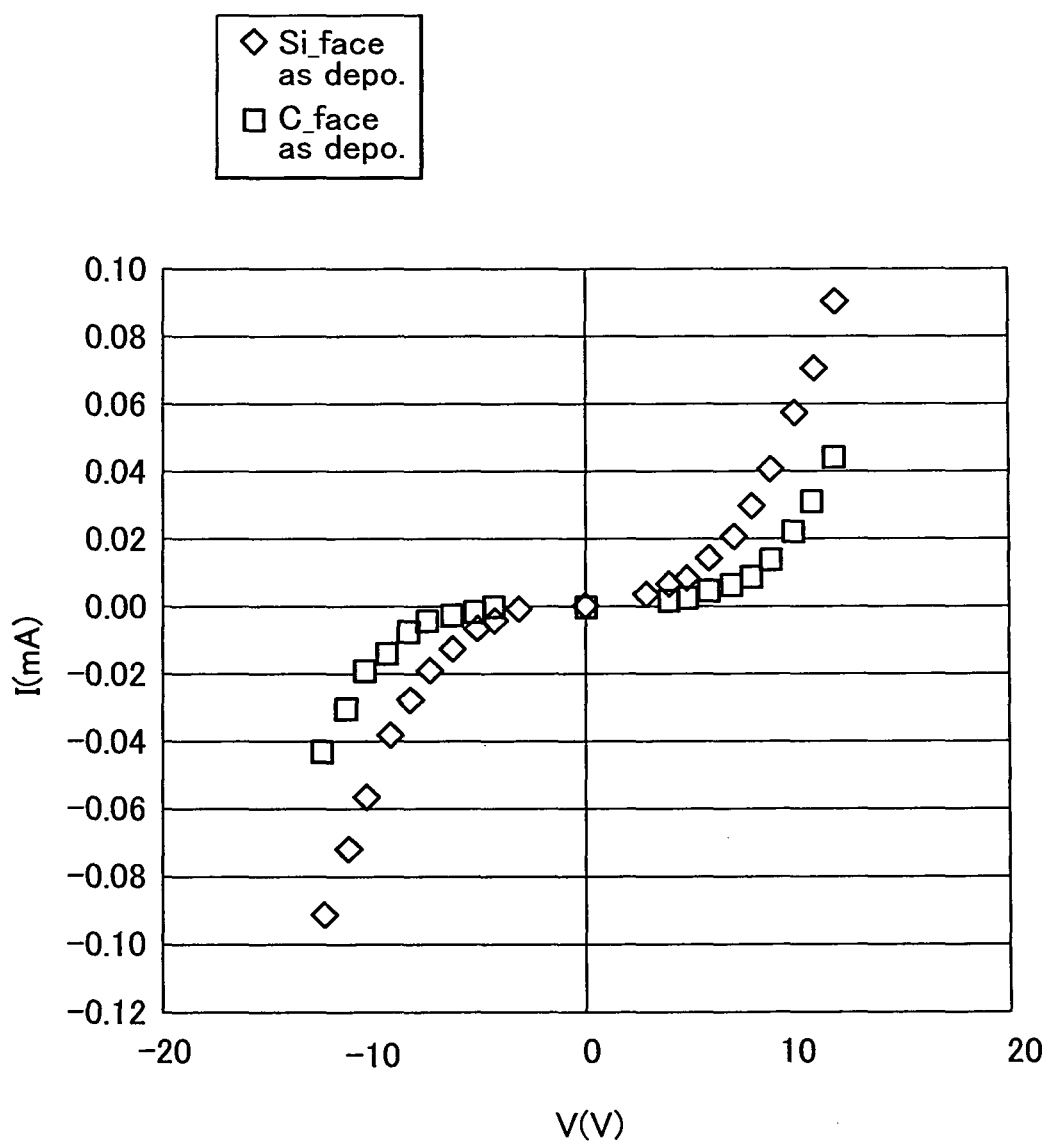
FIG. 9 is a graph showing current-voltage characteristics of an ohmic electrode for a p-type SiC semiconductor according to another comparative example.

Referring to FIGS. 6 and 7 and FIGS. 8 and 9, it is understood that an ohmic electrode layer of which the composition ratio is within the composition range demonstrates low-resistance ohmic properties even when a surface of a p-type SiC semiconductor is a Si-face or a C-face as shown in FIGS. 6 and 7, whereas an electrode layer of which the composition ratio is outside the composition range does not demonstrate ohmic properties as shown in FIGS. 8 and 9. Further, referring to FIG. 10, it is understood that when Ti and Al are deposited to form a deposited film according to the related art, ohmic properties are not obtained unless a thermal treatment is carried out, and that the surface smoothness deteriorates through the thermal treatment.

Figure 11:
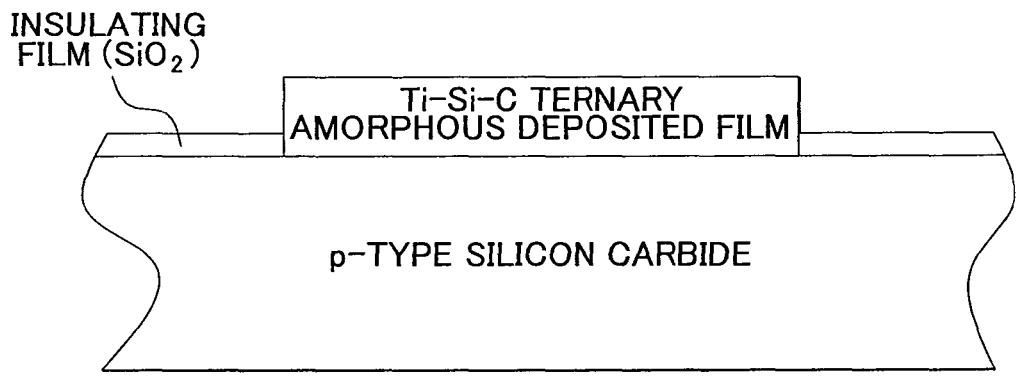
FIG. 11 is a schematic view showing an outline of a method of forming an ohmic electrode for a p-type SiC semiconductor according to the embodiment of the invention.
Figure 12:
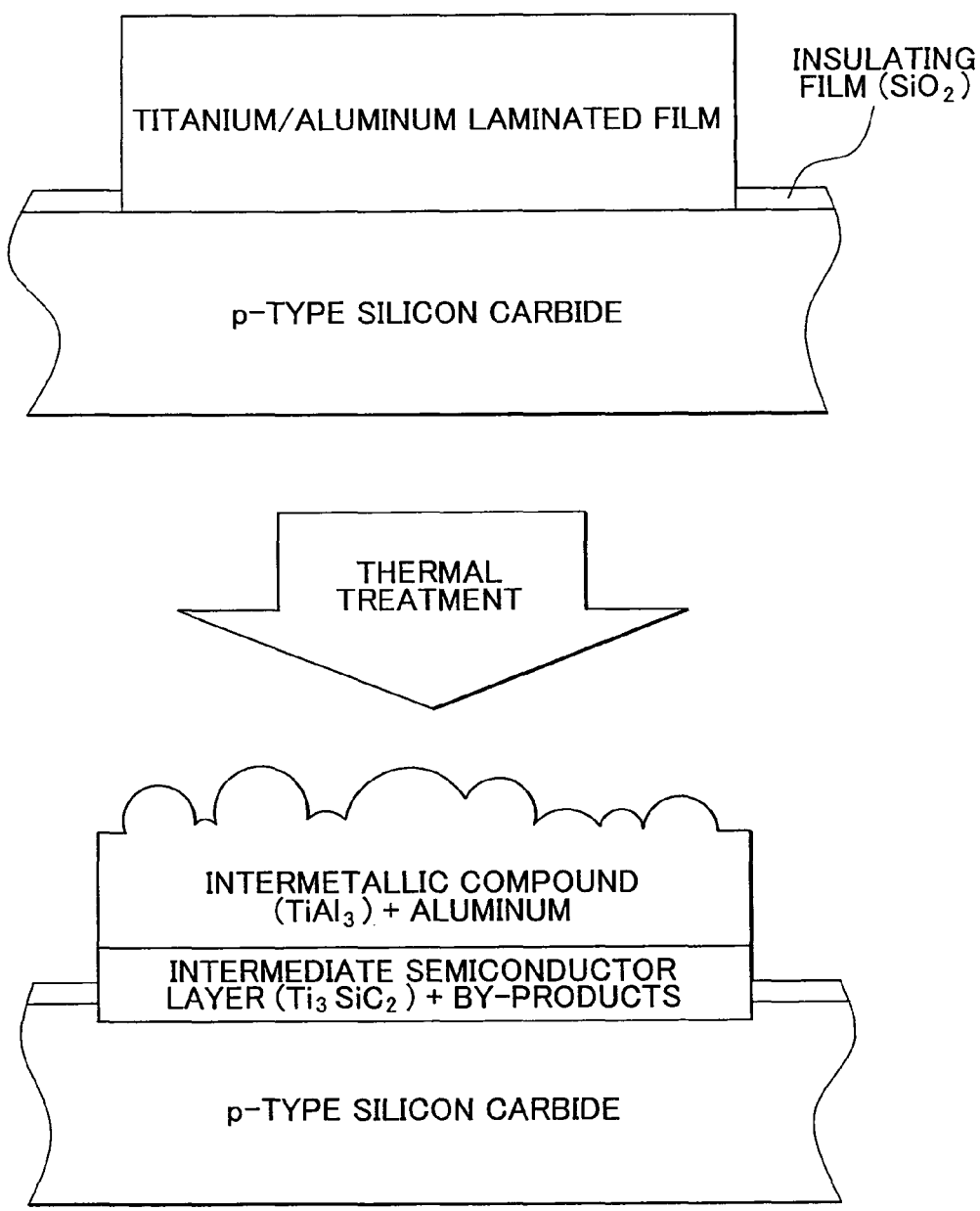
FIG. 12 is a schematic view showing a method of forming an ohmic electrode for a p-type SiC semiconductor according to the related art.

Furthermore, referring to FIGS. 11 and 12, it is considered that a method of forming an ohmic electrode for a p-type SiC semiconductor according to the embodiment of the invention is designed to directly laminate the ohmic electrode layer on a surface of the p-type SiC semiconductor by fulfilling four treatment conditions, namely, (1) setting the composition ratio of a ternary composite film to a composition ratio $Ti_{(1-x-y)}Si_{(x)}$—$C_{(y)}$ within the composition range, (2) preventing crystallization during sputtering (referred to also as sputter), (3) prohibiting performance of a thermal treatment at a high temperature after sputtering, and (4) performing a pre-sputter deposition treatment (reverse sputtering), whereas a method of forming an ohmic electrode for a p-type SiC semiconductor according to the related art is designed to laminate a Ti/Al laminated film on a surface of the p-type SiC semiconductor and carrying out a thermal treatment at a high temperature. In the method according to the related art, by-products such as $Al_4C_3$, $Ti_5Si_3C_x$, TiC and the like are produced on the ohmic electrode, layers of an intermetallic compound ($TiAl_3$) as a component containing Al or a coagulation of Al are formed on the $Ti_3SiC_2$ ohmic electrode layer. Therefore, surface smoothness of these layers is low, resulting in deterioration of ohmic properties.

In the foregoing embodiment of the invention, with a view to avoiding crystallization during sputtering, a rise in the temperature in a deposition chamber is suppressed by, for example, cooling a SiC semiconductor substrate, preventing an excessive increase in RF power (high-frequency sputtering), controlling the pressure in the chamber, or the like. It is appropriate to set the aforementioned temperature during sputter deposition equal to or lower than 10° C. with or without the aid of, for example, a coolant or a cooling medium, for example, a fluorinated inactive cooling medium such as galden, fluorinert or the like. At this time, the deposited film is considered to assume an amorphous structure through rapid solidification from a gas phase. Further, when the exposed Ti—Si—C ohmic electrode is heated after deposition, for example, in subsequent steps, it is preferable that the temperature of the surface of the Ti—Si—C electrode layer be equal to or lower than 800° C., especially equal to 400° C. Further, it is appropriate that the RF power (high-frequency sputtering) be equal to or smaller than 600 W, for example, 100 W to 600 W, and above all 100 W to 300 W. If the RF power is large, minute crystals tend to be produced. Further, it is preferable that the pressure in the deposition chamber be 0.1 Pa to 10 Pa, especially 1 Pa to 5 Pa. In addition, chemical cleaning or physical cleaning such as reverse sputtering, which is generally employed in deposition technology, can be mentioned as the aforementioned pre-sputter deposition treatment.

The SiC used to form the p-type SiC semiconductor according to the invention is not limited in particular, and many polytypes such as 3C—SiC, 4H—SiC, 6H—SiC and the like can be mentioned. In the invention, however, SiC having any one of the crystal structures can be used, and it is preferable to use 4H—SiC. Each of these SiCs, which are single crystals, is mechanically cut into a Si-face and a C-face according to a method known in the field. The Si-face or C-face thus obtained, preferably the Si-face can be used to as a surface on which the ohmic electrode is directly laminated. Since this SiC is a very hard material, it is difficult to increase the degree of flatness of the cut-out portions. If a metal electrode is pressure-bonded to a p-type SiC semiconductor substrate, the metal electrode is bonded to the p-type SiC semiconductor with a gap left therebetween, and it is difficult to obtain a low-resistance contact. In general, therefore, an electrode component is deposited so as to be laminated on the p-type SiC semiconductor. However, the invention makes it possible to obtain a low-resistance contact through direct lamination of the ohmic electrode layer. The SiC semiconductor according to the invention is obtained by forming a p-type carrier by doping the SiC with appropriate dopants according to a known method, and adjusting the electronic characteristics of the carrier by adjusting the manner of doping the SiC with the dopants. The electronic characteristics are usually adjusted before the lamination of the ohmic electrode layer, but may be adjusted after the lamination of the ohmic electrode layer.

Figure 10:
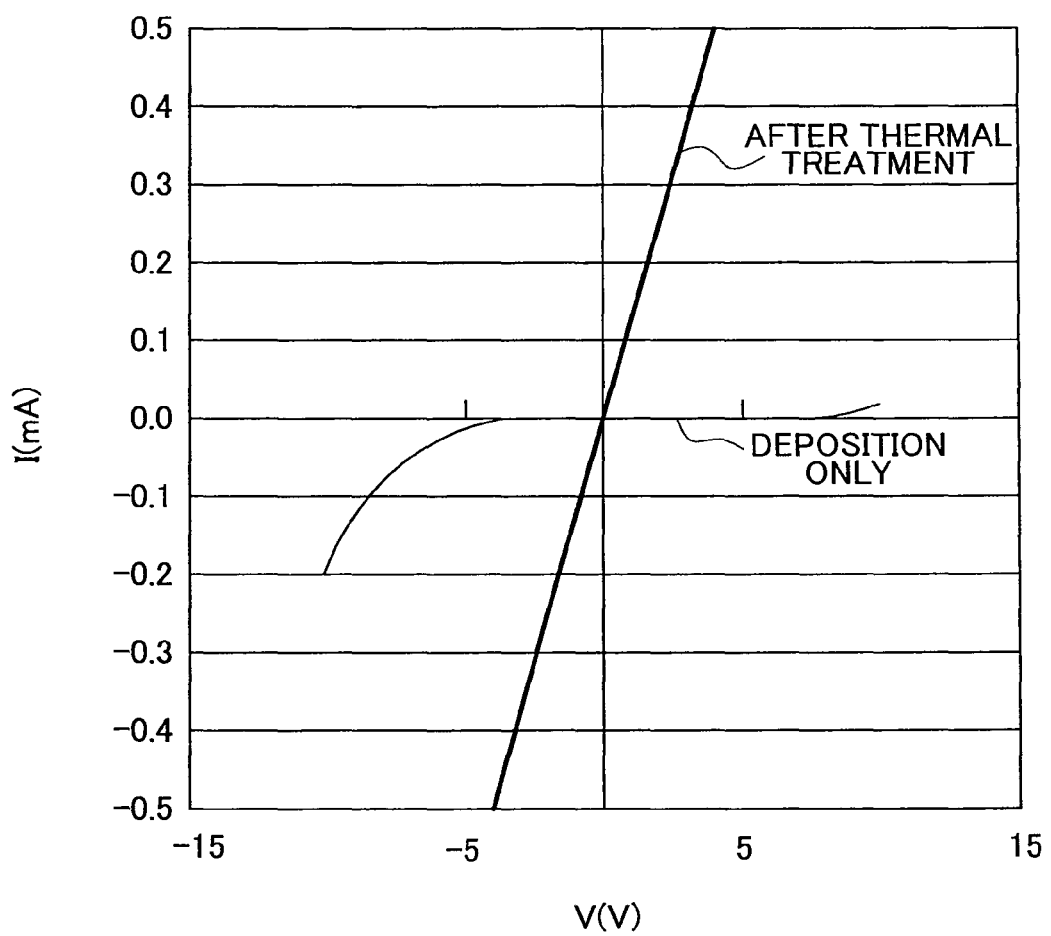
FIG. 10 is a graph showing current-voltage characteristics of an electrode which is formed through a DA method using Al/Ti 5 and current-voltage characteristics after SiC is subjected to a thermal treatment in Comparative Example.

A method of forming a ternary deposited film composed of Ti, Si and C in a composition ratio within the composition range on the surface of the SiC semiconductor substrate sufficiently cleaned and purified as shown in FIG. 10 can be mentioned as a method of forming a ternary film composed of Ti, Si and C in a composition ratio within the composition range. The aforementioned ternary deposited film can be formed by depositing, as a target, a given material containing the aforementioned elements, namely, Ti, Si and C in a composition ratio within the element composition range mentioned above, for example, a powder, mass or mold of Ti, Si and C (carbon), a powder, mass or mold of Ti, SiC and C, a powder, mass or mold of Ti, Si and TiC, or a powder, mass or mold in one of a $TiC+Ti_5Si_3C_x$ two-phase equilibrium composition range, a $TiC+Ti_5Si_3C_x$ three-phase equilibrium composition range, and a $TiC+Ti_5Si_3C_x+Ti$ three-phase equilibrium composition range, using a deposition device such as a high-frequency magnetron sputtering device under conditions that a discharge atmosphere is a noble gas atmosphere, for example, an Ar atmosphere, an output is Ar forward output of 600 W or less, for example, 100 W to 600 W, above all 100 W to 300 W, and preferably 200 W to 300 W, a pressure is 0.1 Pa to 10 Pa, especially 1 Pa to 5 Pa, and a deposition period is, for example, 5 seconds to 500 seconds, preferably 10 seconds to 360 seconds.

According to the aforementioned method, the sputter-deposited film does not require any high-temperature thermal treatment. Therefore, an ohmic electrode in a smooth state at the time of deposition, demonstrating ohmic properties and having an amorphous structure can be obtained by laminating a ternary film (a deposited film) on a purified surface of a SiC semiconductor under the aforementioned conditions that a $Ti_{(z)}Si_{(x)}C_{(y)}$ ternary film of which the composition ratio is within the composition range is used. Since the composition range can be widened, the sputtering device exerts no or almost no influence on ohmic properties. Since the electrode layer has an amorphous structure, there is no crystal grain boundary resulting from polycrystal. Although the mechanism according to which the ternary electrode film having a composition ratio $Ti_{(z)}Si_{(x)}C_{(y)}$ within the composition range and having an amorphous structure obtained through the aforementioned method demonstrates ohmic properties on an interface with the p-type SiC semiconductor has not been elucidated, it is considered that ohmic properties are obtained as a result of the effective formation of an interface electronic structure with a reduced Schottky barrier or a tunneling phenomenon.

In the invention, an ohmic electrode layer having an amorphous structure and having a composition ratio $Ti_{(z)}Si_{(x)}C_{(y)}$ within the composition range can be directly laminated on a p-type SiC semiconductor through the lamination of a ternary film having a composition ratio within the composition range and a thickness of preferably 500 nm or less, especially 5 nm to 500 nm. Further, in the invention, an ohmic electrode for a p-type SiC semiconductor with an ohmic electrode layer exhibiting good surface smoothness, namely, a surface roughness below 0.1 μm, especially 0.05 μm or less, demonstrating good ohmic properties and having an amorphous structure can be easily obtained by incorporating the aforementioned pre-deposition treatment.

According to the invention, a $Ti_{(z)}Si_{(x)}C_{(y)}$ electrode layer having an amorphous structure, which is in contact with a SiC semiconductor substrate, is thin over the entirety of an electrode portion, and has a uniform thickness, can be formed, and a side reaction producing $Al_4C_3$, $Ti_5Si_3C_x$, $TiC$, $Al_3Ti$ and the like on an interface between a SiC semiconductor and the electrode portion can be suppressed. It is thus considered that an ohmic electrode having good ohmic properties and having an amorphous structure can be obtained. Further, according to the invention, an ohmic electrode having an amorphous structure, which is in contact with SiC, is thin, and has a smooth surface, can be formed through a simplified process of chemical and/or physical cleaning of the surface of a p-type SiC semiconductor and direct formation of an electrode film through deposition. In addition, at the same time, according to the invention, the resistance to chemicals and the resistance to corrosion by the atmosphere of oxidizing gas can be enhanced, and improvements can be made in terms of process cost, performance and reliability.

Examples of the invention and comparative examples will be described hereinafter. In the following examples, an evaluation on the characteristics of samples was made according to methods described below. It should be noted that the following measuring methods are examples, and that the measurement can be carried out using other equivalent devices under other equivalent conditions. 1) As for a method of calculating a composition ratio of an electrode layer, this composition ratio is calculated from a composition ratio of a material or with the aid of an electron probe X-ray micro-analyzer (EPMA). 2) As for a method of measuring ohmic properties of the electrode layer, this measurement is carried out using a device for measuring current-voltage (I-V) characteristics between electrodes, that is, a high-accuracy digital multimeter R6581 (produced by Advantest Corporation) or a constant-voltage power supply KX-100H (produced by Takasago Ltd.). 3) As for a method of measuring the structure of the electrode layer, a cross-section of the electrode is observed through TEM and it is determined from a photograph of a $Ti_{(z)}$—$Si_{(x)}$—$C_{(y)}$ deposited film whether there is an amorphous structure or a crystal structure. 4) As for a method of measuring a surface roughness of the electrode layer, an arithmetic average roughness (μm) is measured with the aid of a stylus contact-type surface roughness measuring instrument, a surf coder SE-40C (produced by Kosaka Laboratory Ltd.) (detector model: DR-30).

Example 1

As a semiconductor substrate material, p-type 4H—SiC with a thickness of 369 μm, a specific resistance of 75 Ωcm to 2500 Ωcm, and a plane orientation of (0001) 8° off toward (11-20) was used, and a Si-face (a C-face as well for confirmation) was formed as a surface on which an electrode is formed. As a deposition condition, high-frequency magnetron sputter deposition and a sputtering target of Ti, Si and C (with the purities of Ti: 99.9%, Si: 99.99% and C: 99.99%) in a composition ratio between the elements shown in Table 1 (NO. 3 in FIG. 3) were adopted. An electrode layer made of a $Ti_{(z)}$—$Si_{(x)}$—$C_{(y)}$ film was formed by carrying out a substrate cleaning treatment prior to deposition in the Ar atmosphere as a discharge atmosphere, at a high-frequency output of 200 W, and for a time of 300 seconds, and then performing deposition with a film thickness of 350 nm, in the Ar atmosphere as the discharge atmosphere, at a pressure of 1 Pa to 4 Pa, and at a high-frequency output of 200 W to 300 W. The respective characteristics of the obtained electrode were evaluated. FIG. 4 shows a copy of a TEM photograph of a cross-section of the electrode, and FIG. 6 shows a measurement result of I-V characteristics. Table 1 shows results of determinations on ohmic properties made from FIG. 6 together with the results of other examples. It is apparent from FIG. 4 that the electrode layer obtained in Example 1 has an amorphous structure. Further, the surface roughness of the obtained electrode layer was 0.05 μm, and the electrode layer demonstrated good surface smoothness.

Comparative Example 1

The electrode layer made of the $Ti_{(z)}$—$Si_{(x)}$—$C_{(y)}$ film obtained in Example 1 was subjected to a thermal treatment for 15 minutes at 1000° C. FIG. 5 shows a TEM photograph of a cross-section of the electrode layer after the thermal treatment. Respective characteristics of the obtained electrode layer were evaluated. FIG. 5 shows a copy of a TEM photograph of the cross-section of the electrode. Further, the measurement shows that the surface roughness was 0.1 μm to 0.2 μm and that the surface smoothness was slightly decreased. FIG. 5 shows that the $Ti_{(z)}$—$Si_{(x)}$—$C_{(y)}$ electrode layer having an amorphous structure was polycrystallized through a thermal treatment.

Example 2

A $Ti_{(z)}$—$Si_{(x)}$—$C_{(y)}$ electrode layer was formed on a Si-face of a p-type SiC semiconductor in the same manner as in Example 1 except that the composition ratio between Ti, Si and C (with the purities of Ti: 99.9%, Si: 99.99% and C: 99.99%) as a sputtering target was changed to the composition ratio shown in Table 1 (NO. 4 in FIG. 3). Table 1 shows the results of determination on ohmic properties made based on the I-V characteristics of the obtained electrode. Table 1 shows that the electrode layer obtained in Example 2 has good ohmic properties (the Si-face). Further, judging from these results and a film formation conditions, it is implied that the electrode layer obtained in Example 2 has an amorphous structure and has good surface smoothness as in the case of the electrode layer obtained, in Example 1.

Example 3

A $Ti_{(z)}$—$Si_{(x)}$—$C_{(y)}$ electrode layer was formed on a Si-face of a p-type SiC semiconductor in the same manner as in Example 1 except that the composition ratio between Ti, Si and C (with the purities of Ti: 99.9%, Si: 99.99% and C: 99.99%) as a sputtering target was changed to the composition ratio shown in Table 1 (NO. 5 in FIG. 3). Table 1 shows the results of determination on ohmic properties made based on the I-V characteristics of the obtained electrode. Table 1 shows that the electrode layer obtained in Example 3 has good ohmic properties (the Si-face). Further, judging from these results and a film formation condition, it is implied that the electrode layer obtained in Example 3 has an amorphous structure and has good surface smoothness as in the case of the electrode layer obtained in Example 1.

Example 4

A $Ti_{(z)}$—$Si_{(x)}$—$C_{(y)}$ electrode layer was formed on a Si-face of a p-type SiC semiconductor in the same manner as in Example 1 except that the composition ratio between Ti, Si and C (with the purities of Ti: 99.9%, Si: 99.99% and C: 99.99%) as a sputtering target was changed to the composition ratio shown in Table 1. (NO. 6 in FIG. 3). Table 1 shows the results of determination on ohmic properties made based on the I-V characteristics of the obtained electrode. Table 1 shows that the electrode layer obtained in Example 4 has good ohmic properties (the Si-face). Further, judging from these results and a film formation condition, it is implied that the electrode layer obtained in Example 4 has an amorphous structure and has good surface smoothness as in the case of the electrode layer obtained in Example 1.

Example 5

A $Ti_{(z)}$—$Si_{(x)}$—$C_{(y)}$ electrode layer was formed in the same manner as in Example 1 except that the composition ratio between Ti, Si and C (with the purities of Ti: 99.9%, Si: 99.99% and C: 99.99%) as a sputtering target was changed to the composition ratio shown in Table 1 (NO. 7 in FIG. 3). FIG. 7 shows the I-V characteristics of the obtained electrode, and Table 1 shows the results of determination on ohmic properties made based on the results. Further, the TEM photograph of the cross section of the electrode layer showed that the electrode layer has an amorphous structure as in FIG. 6, and showed that the electrode layer exhibited good surface smoothness, namely, a surface roughness of 0.05 µm.

Comparative Example 2

A $Ti_{(z)}$—$Si_{(x)}$—$C_{(y)}$ electrode layer was formed in the same manner as in Example 1 except that the composition ratio between Ti, Si and C (with the purities of Ti: 99.9%, Si: 99.99% and C: 99.99%) as a sputtering target was changed to the composition ratio shown in Table 1 (NO. 1 in FIG. 3). FIG. 9 shows the I-V characteristics of the obtained electrode, and Table 1 shows the results of determination on ohmic properties made based on the results. Further, the obtained electrode layer was subjected to a thermal treatment in the same manner as in Comparative Example 1. The result of an evaluation on the ohmic properties of the electrode after the thermal treatment showed that the electrode did not demonstrate ohmic properties.

Comparative Example 3

A $Ti_{(z)}$—$Si_{(x)}$—$C_{(y)}$ electrode layer was formed in the same manner as in Example 1 except that the composition ratio between Ti, Si and C (with the purities of Ti: 99.9%, Si: 99.99% and C: 99.99%) as a sputtering target was changed to the composition ratio shown in Table 1 (NO. 2 in FIG. 3). FIG. 8 shows the I-V characteristics of the obtained electrode, and Table 1 shows the results of determination on ohmic properties made based on the results. Further, the obtained electrode layer was subjected to a thermal treatment in the same manner as in Comparative Example 1. The result of an evaluation on the ohmic properties of the electrode after the thermal treatment showed that the electrode did not demonstrate ohmic properties.

Comparative Example 4

An electrode layer was formed in the same manner as in Example 1 except that the composition ratio between Ti, Si and C (with the purities of Ti: 99.9%, Si: 99.99% and C: 99.99%) as a sputtering target was changed to the composition ratio shown in Table 1 (NO. 8 in FIG. 3). Table 1 shows the results of determination on ohmic properties made based on the I-V characteristics of the obtained electrode.

Comparative Example 5

As a semiconductor substrate material, p-type 4H—SiC with a thickness of 369 µm, a specific resistance of 75 Ωcm to 2500 Ωcm, a plane orientation of (0001) 8° off toward (11-20), and a Si surface as a surface on which an electrode is formed was used, and a deposited film was laminated under the conditions that an electron beam deposition device is used as a deposition device and Ti and Al are used as deposited materials. Thus, a laminated body having a deposited layer of Ti (80 nm)/Al (375 nm) on a surface of a semiconductor was obtained. I-V characteristics and a surface roughness of an electrode of the obtained laminated body were measured. FIG. 10 shows the I-V characteristics. The surface roughness was 0.05 µm. This laminated body was subjected to a thermal treatment, namely, was heated under the atmosphere of Ar or $N_2$ (at an atmospheric pressure), at 1000° C., and for 10 minutes to form an ohmic electrode. FIG. 10 shows the surface roughness and I-V characteristics of the obtained ohmic electrode. The result of observation of the roughness showed that the surface roughness was 1.0 µm, that is, the surface smoothness was not good, and that the ohmic electrode demonstrated ohmic properties.

TABLE 1

| | Number in FIG. 3 | 1 − x − y | x | y | Ohmic Properties |
|---|---|---|---|---|---|
| Comparative Example 2 | 1 | 0.41 | 0.33 | 0.26 | Not demonstrated |
| Comparative Example 3 | 2 | 0.33 | 0.17 | 0.50 | Demonstrated |
| Example 1 | 3 | 0.63 | 0.21 | 0.16 | Demonstrated |
| Example 2 | 4 | 0.62 | 0.14 | 0.24 | Demonstrated |
| Example 3 | 5 | 0.57 | 0.24 | 0.19 | Demonstrated |
| Example 4 | 6 | 0.54 | 0.16 | 0.30 | Demonstrated |
| Example 5 | 7 | 0.49 | 0.12 | 0.39 | Demonstrated |
| Comparative Example 4 | 8 | 1.0 | 0 | 0 | Not demonstrated |

* x, y: Ti(1 − x − y)Si(x)C(y)

The above results show that the $Ti_{(z)}$—$Si_{(x)}$—$C_{(y)}$ electrode layer obtained according to each of Examples 1 to 5 has good surface smoothness and ohmic properties (as to the Si-face or both the Si-face and the C-face). Further, the result of Comparative Example 1 shows that the $Ti_{(z)}$—$Si_{(x)}$—$C_{(y)}$ electrode layer having the amorphous structure is polycrystallized through a high-temperature thermal treatment. Further, the results in FIG. 3 and Table 1 show that an electrode layer having ohmic properties is obtained without the need to strictly control the composition ratio thereof. In addition, the results of Comparative Examples 2 to 4 in Table 1 show that the ohmic properties are not obtained when the composition ratio between Ti, Si and C is outside the composition range according to the invention. Further, the laminated body obtained by depositing the Ti/Al deposited film on the semiconductor substrate material in Comparative Example 5 has good smoothness but does not demonstrate ohmic properties. This shows that the smoothness was lost although the ohmic properties are obtained through a thermal treatment.

Example 6

FIG. 13 is a schematic view showing a field-effect transistor made of SiC to which the ohmic electrode for the p-type SiC semiconductor according to the invention is applied.

Example 7

Figure 14:
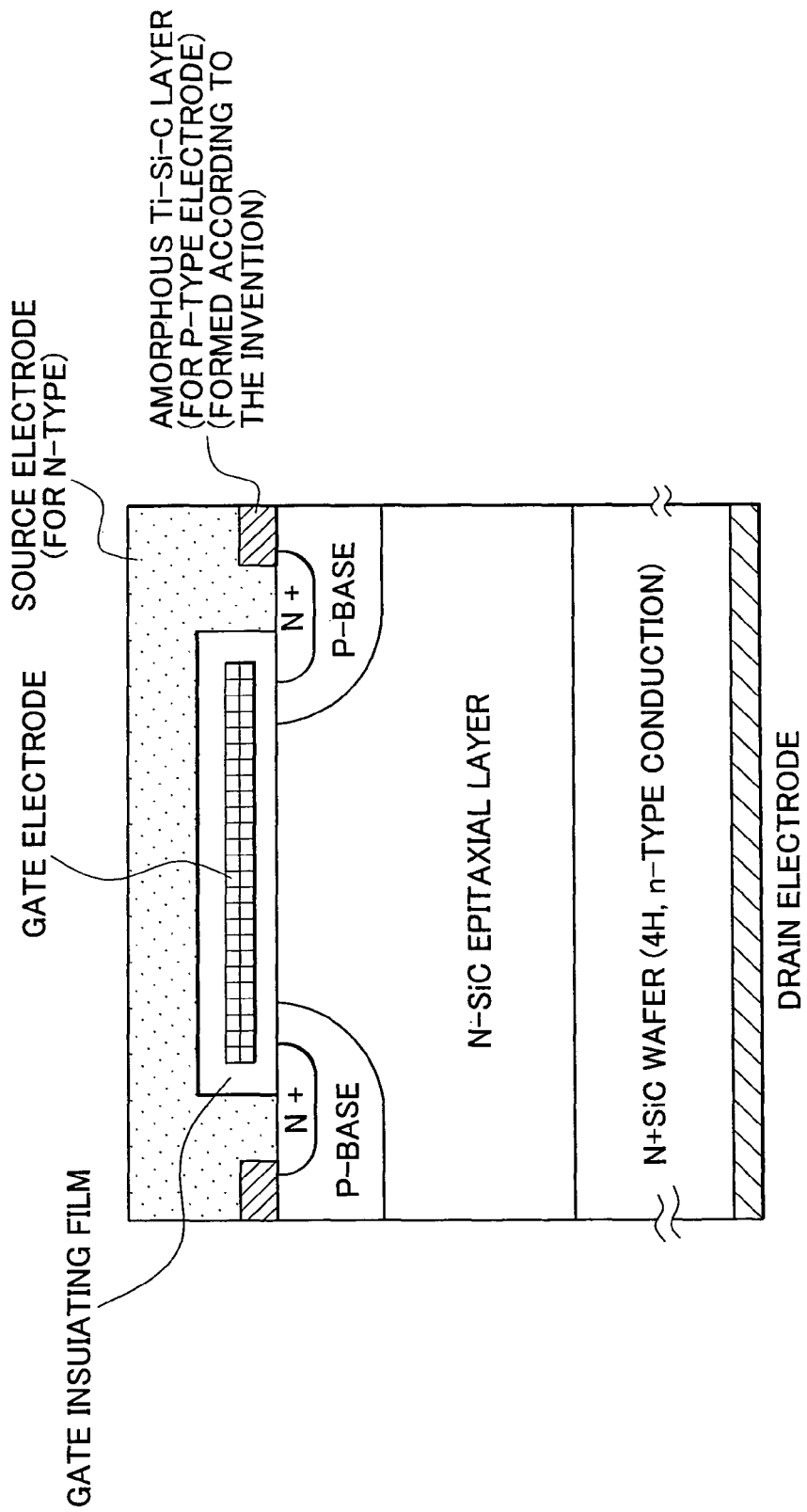
FIG. 14 is a schematic view showing an example of a silicon carbide N-channel power field-effect transistor having a vertical structure as another application example of the ohmic electrode for the p-type SiC semiconductor according to the invention.

FIG. 14 is a schematic view showing an N-channel power field-effect transistor (a power MOSFET) to which the ohmic electrode for the p-type SiC semiconductor according to the invention is applied.

Example 8

Figure 15:
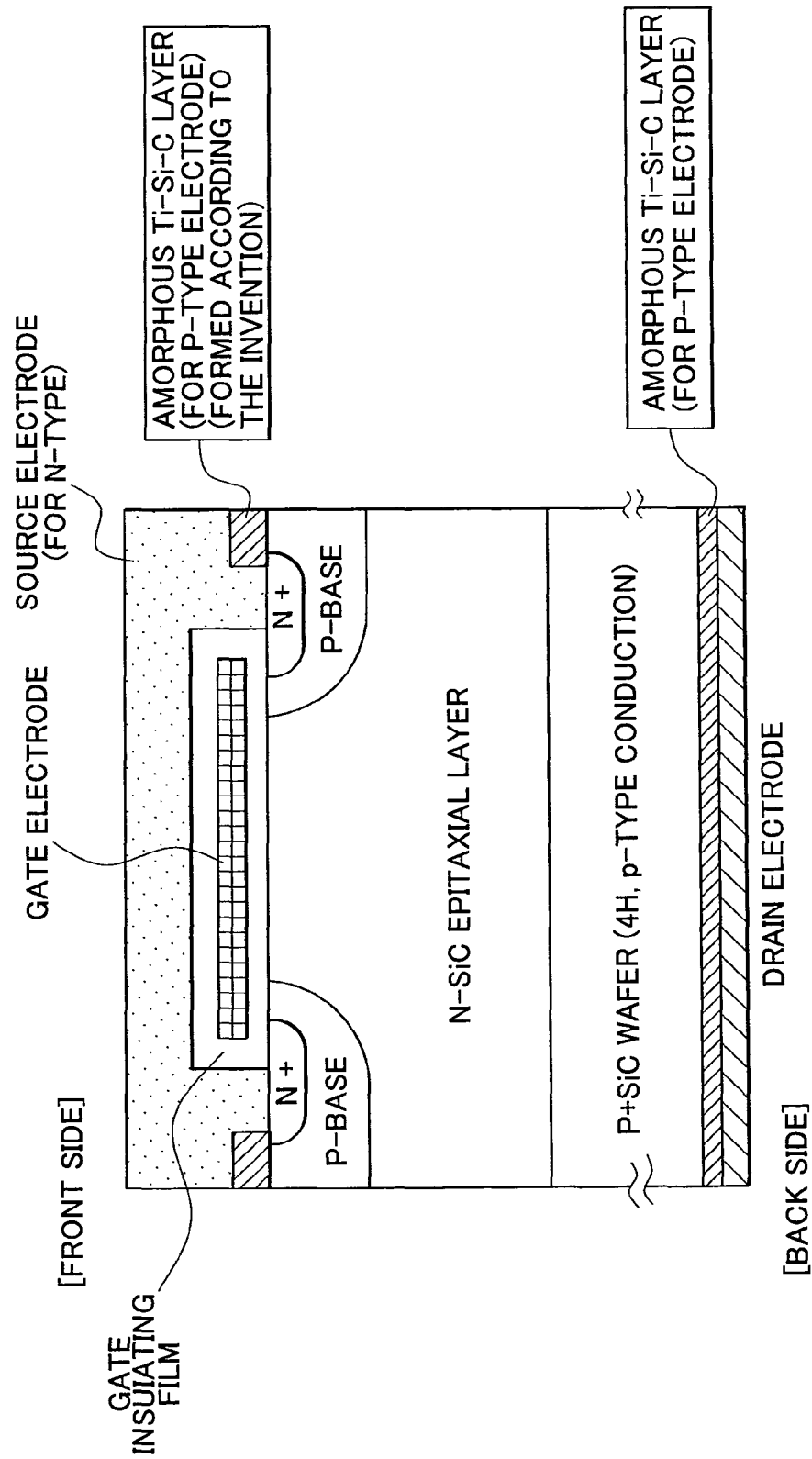
FIG. 15 is a schematic view showing an example of a silicon carbide N-channel insulated gate bipolar transistor having a vertical structure as still another application example of the ohmic electrode for the p-type SiC semiconductor according to the invention.

FIG. 15 is a schematic view showing a SiC N-channel insulated gate bipolar transistor (an IGBT) to which the ohmic electrode for the p-type SiC semiconductor according to the invention is applied. The IGBT shown in FIG. 15 can ensure ohmic properties at a room temperature or a relatively low temperature. Therefore, a drain electrode on a back side can be realized without being affected by heat even after the completion of a surface process such as formation of a gate oxidized film, ion implantation or the like.

According to the invention, even in the case of a p-type semiconductor in which there has not been so far established an art for stably forming an ohmic electrode, it is possible to obtain an ohmic electrode that demonstrates good ohmic properties, has an amorphous structure, hence has no crystal boundary, and is good in surface smoothness. As a result, a SiC-group power electronics device can be substituted for a conventional silicon-group device, and a drastic rise in the energy efficiency of various electronic instruments and electric motors (motors, generators and the like) can be realized.

The invention claimed is:

1. A method of forming an ohmic electrode for a p-type SiC semiconductor, comprising:
    subjecting a surface of a p-type semiconductor to a pre-sputter deposition treatment; and
    directly laminating, through sputter deposition, an ohmic electrode layer, which forms the ohmic electrode, which is made of a $Ti(1-x-y)Si(x)C(y)$ ternary film of which a composition ratio is on a line or curve, or is within a composition range that is surrounded by two lines and two curves, expressed by an expression $x=0$ ($0.35 \leq y \leq 0.5$), an expression $y=-1.120x+0.5200$ ($0.1667 \leq x \leq 0.375$), an expression $y=1.778(x-0.375)^2+0.1$ ($0 \leq x \leq 0.375$), and an expression $y=-2.504x^2-0.5828x+0.5$ ($0 \leq x \leq 0.1667$), except that composition ratios that are on a line expressed by the expression $x=0$ are excluded, on the surface of the p-type SiC semiconductor, wherein
    a temperature in a sputtering chamber during the sputter deposition is adjusted to a temperature at which crystallization of the electrode layer does not occur; and
    a thermal treatment at a temperature at which crystallization of the electrode layer occurs is prohibited after the sputter deposition.

2. The method according to claim 1, wherein in the pre-sputtering deposition treatment, the surface of the p-type semiconductor is physically or chemically cleaned.

* * * * *